(12) United States Patent
Harada et al.

(10) Patent No.: US 10,847,420 B2
(45) Date of Patent: Nov. 24, 2020

(54) WAFER PROCESSING METHOD

(71) Applicant: DISCO CORPORATION, Tokyo (JP)

(72) Inventors: Shigenori Harada, Tokyo (JP); Minoru Matsuzawa, Tokyo (JP); Hayato Kiuchi, Tokyo (JP); Yoshiaki Yodo, Tokyo (JP); Taro Arakawa, Tokyo (JP); Masamitsu Agari, Tokyo (JP); Emiko Kawamura, Tokyo (JP); Yusuke Fujii, Tokyo (JP); Toshiki Miyai, Tokyo (JP); Makiko Ohmae, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/400,209

(22) Filed: May 1, 2019

(65) Prior Publication Data
US 2019/0348326 A1 Nov. 14, 2019

(30) Foreign Application Priority Data

May 14, 2018 (JP) ................. 2018-092802

(51) Int. Cl.
*H01L 21/78* (2006.01)
*B23K 26/364* (2014.01)
(Continued)

(52) U.S. Cl.
CPC ............ *H01L 21/78* (2013.01); *B23K 26/364* (2015.10); *B23K 26/40* (2013.01); *C09J 7/241* (2018.01);
(Continued)

(58) Field of Classification Search
CPC ....... H01L 21/78; H01L 21/3043; C09J 7/241
See application file for complete search history.

(56) References Cited

U.S. PATENT DOCUMENTS 3,690,984 A 9/1972 Wanesky
6,890,836 B2 * 5/2005 Howard .............. H01L 21/6836
257/E21.238
(Continued)

FOREIGN PATENT DOCUMENTS

JP 07045556 A 2/1995
JP 10305420 11/1998
JP 2002192370 7/2002

OTHER PUBLICATIONS

Harada, Shigenori, U.S. Appl. No. 16/419,126, filed May 22, 2019.
(Continued)

*Primary Examiner* — William Coleman
(74) *Attorney, Agent, or Firm* — Greer Burns & Crain, Ltd.

(57) ABSTRACT

A wafer processing method includes a polyolefin sheet providing step of positioning a wafer in an inside opening of a ring frame and providing a polyolefin sheet on a back side of the wafer and on a back side of the ring frame, a uniting step of heating the polyolefin sheet as applying a pressure to the polyolefin sheet to thereby unite the wafer and the ring frame through the polyolefin sheet by thermocompression bonding, a dividing step of cutting the wafer by using a cutting apparatus to thereby divide the wafer into individual device chips, and a pickup step of picking up each device chip from the polyolefin sheet.

11 Claims, 10 Drawing Sheets

(51) Int. Cl.
   *B23K 26/40* (2014.01)
   *H01L 21/683* (2006.01)
   *C09J 7/24* (2018.01)
   *H01L 21/304* (2006.01)

(52) U.S. Cl.
   CPC ...... *H01L 21/3043* (2013.01); *H01L 21/6836* (2013.01); *H01L 2221/6834* (2013.01); *H01L 2221/68327* (2013.01)

(56) References Cited

U.S. PATENT DOCUMENTS

| | | | |
|---|---|---|---|
| 8,975,161 B2* | 3/2015 | Katou | H01L 21/67092 |
| | | | 438/460 |
| 9,786,541 B2* | 10/2017 | Shinoda | H01L 21/6836 |
| 2006/0169680 A1 | 8/2006 | Park | |
| 2007/0018472 A1 | 1/2007 | Michalsalski | |
| 2007/0275544 A1 | 11/2007 | Maki | |
| 2008/0182095 A1 | 7/2008 | Asai | |
| 2008/0220591 A1 | 9/2008 | Nakamura | |
| 2009/0142906 A1 | 6/2009 | Nakamura | |
| 2010/0015784 A1 | 1/2010 | Nakamura | |
| 2010/0279491 A1 | 11/2010 | Kiuchi | |
| 2012/0028380 A1 | 2/2012 | Takamoto | |
| 2012/0171475 A1 | 7/2012 | Furutani | |
| 2014/0205816 A1 | 7/2014 | Maejima | |
| 2014/0209170 A1 | 7/2014 | Shimazu | |
| 2014/0295646 A1 | 10/2014 | Shinoda | |
| 2016/0071767 A1 | 3/2016 | Hashimoto | |
| 2017/0250102 A1 | 8/2017 | Yoshino | |
| 2018/0197776 A1 | 7/2018 | Ban | |
| 2018/0215571 A1 | 8/2018 | Inoue | |
| 2018/0226359 A1 | 8/2018 | Yokoi | |
| 2018/0281350 A1 | 10/2018 | Tanaka | |
| 2018/0330979 A1 | 11/2018 | Agari | |
| 2019/0088559 A1 | 3/2019 | Hayashishita | |
| 2019/0252364 A1 | 8/2019 | Uzoh | |
| 2019/0348326 A1 | 11/2019 | Harada | |
| 2019/0378747 A1 | 12/2019 | Akutsu | |
| 2019/0378758 A1 | 12/2019 | Harada | |

OTHER PUBLICATIONS

Harada, Shigenori, U.S. Appl. No. 16/419,139, filed May 22, 2019.
Harada, Shigenori, U.S. Appl. No. 16/674,276, filed Nov. 5, 2019.
Harada, Shigenori, U.S. Appl. No. 16/799,161, filed Feb. 24, 2020.
Harada, Shigenori, U.S. Appl. No. 16/831,953, filed Mar. 27, 2020.
Harada, Shigenori, U.S. Appl. No. 16/598,708, filed Oct. 10, 2019.
Harada, Shigenori, U.S. Appl. No. 16/599,502, filed Oct. 11, 2019.
Harada, Shigenori, U.S. Appl. No. 16/674,203, filed Nov. 5, 2019.
Harada, Shigenori, U.S. Appl. No. 16/799,291, filed Feb. 24, 2020.
Harada, Shigenori, U.S. Appl. No. 16/774,689, filed Jan. 28, 2020.
Harada, Shigenori, U.S. Appl. No. 16/554,928, filed Aug. 29, 2019.
Harada, Shigenori, U.S. Appl. No. 16/752,943, filed Jan. 27, 2020.
Harada, Shigenori; U.S. Appl. No. 16/401,145, filed May 2, 2019.

* cited by examiner

WAFER PROCESSING METHOD

BACKGROUND OF THE INVENTION

Field of the Invention

The present invention relates to a wafer processing method for dividing a wafer along a plurality of division lines to obtain a plurality of individual device chips, the division lines being formed on the front side of the wafer to thereby define a plurality of separate regions where a plurality of devices are individually formed.

Description of the Related Art

In a fabrication process for device chips to be used in electronic equipment such as mobile phones and personal computers, a plurality of crossing division lines (streets) are first set on the front side of a wafer formed of a semiconductor, for example, thereby defining a plurality of separate regions on the front side of the wafer. In each separate region, a device such as an integrated circuit (IC), a large-scale integrated circuit (LSI), and a light emitting diode (LED) is next formed. Thereafter, a ring frame having an inside opening is prepared, in which an adhesive tape called a dicing tape is previously attached in its peripheral portion to the ring frame (the back side of the ring frame) so as to close the inside opening of the ring frame. Thereafter, a central portion of the adhesive tape is attached to the back side of the wafer such that the wafer is accommodated in the inside opening of the ring frame. In this manner, the wafer, the adhesive tape, and the ring frame are united together to form a frame unit. Thereafter, the wafer included in this frame unit is processed to be divided along each division line, thereby obtaining a plurality of individual device chips including the respective devices.

For example, a cutting apparatus is used to divide the wafer. The cutting apparatus includes a chuck table for holding the wafer through the adhesive tape and a cutting unit for cutting the wafer. The cutting unit includes a cutting blade for cutting the wafer and a spindle for rotating the cutting blade. The cutting blade has a central through hole, and the spindle is fitted in this central through hole of the cutting blade, so that the cutting blade and the spindle are rotated as a unit. An annular abrasive portion is provided around the outer circumference of the cutting blade, so as to cut the wafer. In cutting the wafer by using this cutting apparatus, the frame unit is placed on the chuck table, and the wafer is held through the adhesive tape on the upper surface of the chuck table. In this condition, the spindle is rotated to thereby rotate the cutting blade, and the cutting unit is next lowered to a predetermined height. Thereafter, the chuck table and the cutting unit are relatively moved in a direction parallel to the upper surface of the chuck table. Accordingly, the wafer is cut along each division line by the cutting blade being rotated, so that the wafer is divided.

Thereafter, the frame unit is transferred from the cutting apparatus to another apparatus for applying ultraviolet light to the adhesive tape to thereby reduce the adhesion of the adhesive tape. Thereafter, each device chip is picked up from the adhesive tape. As a processing apparatus capable of producing the device chips with high efficiency, there is a cutting apparatus capable of continuously performing the operation for dividing the wafer and the operation for applying ultraviolet light to the adhesive tape (see Japanese Patent No. 3076179, for example). Each device chip picked up from the adhesive tape is next mounted on a predetermined wiring substrate or the like.

SUMMARY OF THE INVENTION

The adhesive tape includes a base layer and an adhesive layer formed on the base layer. In cutting the wafer by using the cutting apparatus, the cutting unit is positioned at a predetermined height such that the lower end of the cutting blade reaches a position lower than the lower surface (the back side) of the wafer, so as to reliably divide the wafer. Accordingly, the adhesive layer of the adhesive tape attached to the back side of the wafer is also cut by the cutting blade at the time the wafer is cut by the cutting blade. As a result, in cutting the wafer, cutting dust due to the wafer is generated, and cutting dust due to the adhesive layer is also generated. In cutting the wafer, a cutting water is supplied to the wafer and the cutting blade. The cutting dust generated in cutting the wafer is taken into the cutting water and then diffused on the front side of the wafer. However, the cutting dust due to the adhesive layer is apt to adhere again to the front side of each device. Furthermore, it is not easy to remove this cutting dust adhered to each device in a cleaning step to be performed after cutting the wafer. Accordingly, when the cutting dust due to the adhesive layer adheres to each device formed on the front side of the wafer, there arises a problem such that each device chip may be degraded in quality.

The present invention has been made in view of the above problem, and it is therefore an object of the present invention to provide a wafer processing method which can prevent the adherence of cutting dust to the front side of each device in cutting the wafer, thereby suppressing a degradation in quality of each device chip.

In accordance with an aspect of the present invention, there is provided a wafer processing method for dividing a wafer along a plurality of division lines to obtain a plurality of individual device chips, the division lines being formed on a front side of the wafer to thereby define a plurality of separate regions where a plurality of devices are individually formed. The wafer processing method includes a ring frame preparing step of preparing a ring frame having an inside opening for accommodating the wafer, a polyolefin sheet providing step of positioning the wafer in the inside opening of the ring frame and providing a polyolefin sheet on a back side of the wafer and on a back side of the ring frame, a uniting step of heating the polyolefin sheet as applying a pressure to the polyolefin sheet after performing the polyolefin sheet providing step, thereby uniting the wafer and the ring frame through the polyolefin sheet by thermocompression bonding to form a frame unit in a condition where the front side of the wafer and the front side of the ring frame are exposed upward, a dividing step of cutting the wafer along each division line by using a cutting apparatus including a rotatable cutting blade after performing the uniting step, thereby dividing the wafer into the individual device chips, and a pickup step of picking up each device chip from the polyolefin sheet after performing the dividing step.

Preferably, the uniting step includes a step of applying infrared light to the polyolefin sheet, thereby performing the thermocompression bonding.

Preferably, the polyolefin sheet is larger in size than the ring frame, and the uniting step includes an additional step of cutting the polyolefin sheet after heating the polyolefin sheet, thereby removing a part of the polyolefin sheet outside the outer circumference of the ring frame.

Preferably, the pickup step includes a first step of expanding the polyolefin sheet to thereby increase a spacing between any adjacent ones of the device chips and a second step of pushing up each device chip through the polyolefin sheet after performing the first step.

Preferably, the polyolefin sheet is formed of a material selected from the group consisting of polyethylene, polypropylene, and polystyrene.

In the case that the polyolefin sheet is formed of polyethylene, the polyolefin sheet is preferably heated in the range of 120° C. to 140° C. in the uniting step. In the case that the polyolefin sheet is formed of polypropylene, the polyolefin sheet is preferably heated in the range of 160° C. to 180° C. in the uniting step. In the case that the polyolefin sheet is formed of polystyrene, the polyolefin sheet is preferably heated in the range of 220° C. to 240° C. in the uniting step.

Preferably, the wafer is formed of a material selected from the group consisting of silicon, gallium nitride, gallium arsenide, and glass.

In the wafer processing method according to a preferred embodiment of the present invention, the wafer and the ring frame are united by using the polyolefin sheet having no adhesive layer in place of an adhesive tape having an adhesive layer, thereby forming the frame unit composed of the wafer, the ring frame, and the polyolefin sheet united together. The uniting step of uniting the wafer and the ring frame through the polyolefin sheet is realized by thermo-compression bonding. After performing the uniting step, the wafer is cut to be divided into the individual device chips by using the cutting blade. Thereafter, each device chip is picked up from the polyolefin sheet. Each device chip picked up is next mounted on a predetermined wiring substrate or the like.

In cutting the wafer by using the cutting blade, the polyolefin sheet provided below the wafer is also cut by the cutting blade. That is, the wafer and the polyolefin sheet bonded to the back side of the wafer are cut together by the cutting blade in a condition where the front side of the wafer is oriented upward. Accordingly, cutting dust due to the polyolefin sheet is generated. This cutting dust is taken into cutting water supplied in cutting the wafer and then diffused on the front side of the wafer. However, since the polyolefin sheet has no adhesive layer, the cutting dust does not adhere to the wafer, so that the cutting dust can be removed more reliably in a cleaning step to be performed later. In this manner, according to the preferred embodiment of the present invention, the frame unit can be formed by thermo-compression bonding using the polyolefin sheet having no adhesive layer. Accordingly, cutting dust due to an adhesive layer is not generated in cutting the wafer, so that it is possible to suppress a degradation in quality of each device chip due to such cutting dust having adhesion.

Thus, the wafer processing method according to the preferred embodiment of the present invention can exhibit the effect that cutting dust does not adhere to the front side of each device in cutting the wafer and a degradation in quality of each device chip divided from the wafer can be suppressed.

The above and other objects, features, and advantages of the present invention and the manner of realizing them will become more apparent, and the invention itself will best be understood from a study of the following description and appended claims with reference to the attached drawings depicting a preferred embodiment of the invention.

DETAILED DESCRIPTION OF THE PREFERRED EMBODIMENT

Figure 1:
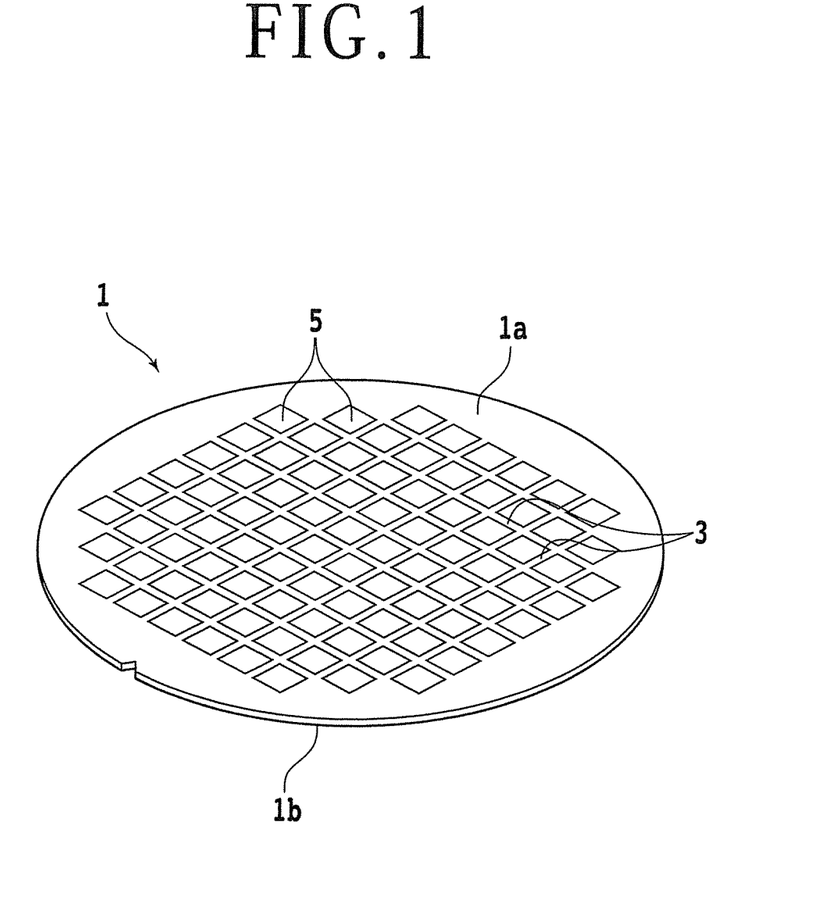
FIG. 1 is a schematic perspective view of a wafer.

A preferred embodiment of the present invention will now be described with reference to the attached drawings. There will first be described a wafer to be processed by a processing method according to this preferred embodiment. FIG. 1 is a schematic perspective view of a wafer 1. The wafer 1 is a substantially disc-shaped substrate formed of a material such as silicon (Si), silicon carbide (SiC), gallium nitride (GaN), and gallium arsenide (GaAs). The wafer 1 may be formed of any other semiconductor materials. Further, the wafer 1 may be formed of a material such as sapphire, glass, and quartz. The wafer 1 has a front side 1a and a back side 1b. A plurality of crossing division lines 3 are formed on the front side 1a of the wafer 1 to thereby define a plurality of separate regions where a plurality of devices 5 such as ICs and LEDs are respectively formed. The crossing division lines 3 are composed of a plurality of parallel division lines 3 extending in a first direction and a plurality of parallel division lines 3 extending in a second direction perpendicular to the first direction. In the processing method for the wafer 1 according to this preferred embodiment, the wafer 1 is cut along the crossing division lines 3 and thereby divided into a plurality of individual device chips individually including the plural devices 5.

The wafer 1 is cut by using a cutting apparatus. Prior to loading the wafer 1 into the cutting apparatus, the wafer 1 is united with a polyolefin sheet 9 (see FIG. 3) and a ring frame 7 (see FIG. 3) to thereby form a frame unit. Thus, the wafer 1 is loaded in the form of such a frame unit into the cutting apparatus and then cut into the individual device chips in the cutting apparatus, in which each device chip is supported to the polyolefin sheet 9. Thereafter, the polyolefin sheet 9 is expanded to thereby increase the spacing between any adjacent ones of the device chips. Thereafter, each device chip is picked up by using a pickup apparatus. The ring frame 7 is formed of a rigid material such as metal, and it has a circular inside opening 7a having a diameter larger than that of the wafer 1. The outside shape of the ring frame 7 is substantially circular. The ring frame 7 has a front side 7b and a back side 7c. In forming the frame unit, the wafer 1 is accommodated in the inside opening 7a of the ring frame 7 and positioned in such a manner that the center of the wafer 1 substantially coincides with the center of the inside opening 7a.

The polyolefin sheet 9 is a flexible (expandable) resin sheet, and it has a flat front side and a flat back side. The polyolefin sheet 9 is a circular sheet having a diameter larger than the outer diameter of the ring frame 7. The polyolefin sheet 9 has no adhesive layer. The polyolefin sheet 9 is a sheet of a polymer (polyolefin) synthesized by polymerizing alkene as a monomer. Examples of the polyolefin sheet 9 include a polyethylene sheet, polypropylene sheet, and polystyrene sheet. The polyolefin sheet 9 is transparent or translucent to visible light. As a modification, the polyolefin sheet 9 may be opaque. Since the polyolefin sheet 9 has no adhesive property, it cannot be attached to the wafer 1 and the ring frame 7 at room temperature. However, the polyolefin sheet 9 is a thermoplastic sheet, so that, when the polyolefin sheet 9 is heated to a temperature near its melting point under a predetermined pressure in a condition where the polyolefin sheet 9 is in contact with the wafer 1 and the ring frame 7, the polyolefin sheet 9 is partially melted and thereby bonded to the wafer 1 and the ring frame 7. That is, by applying heat and pressure to the polyolefin sheet 9 in the condition where the polyolefin sheet 9 is in contact with the wafer 1 and the ring frame 7, the polyolefin sheet 9 can be bonded to the wafer 1 and the ring frame 7. Thusly, in the processing method for the wafer 1 according to this preferred embodiment, all of the wafer 1, the ring frame 7, and the polyolefin sheet 9 are united by thermocompression bonding as mentioned above, thereby forming the frame unit.

Figure 2:
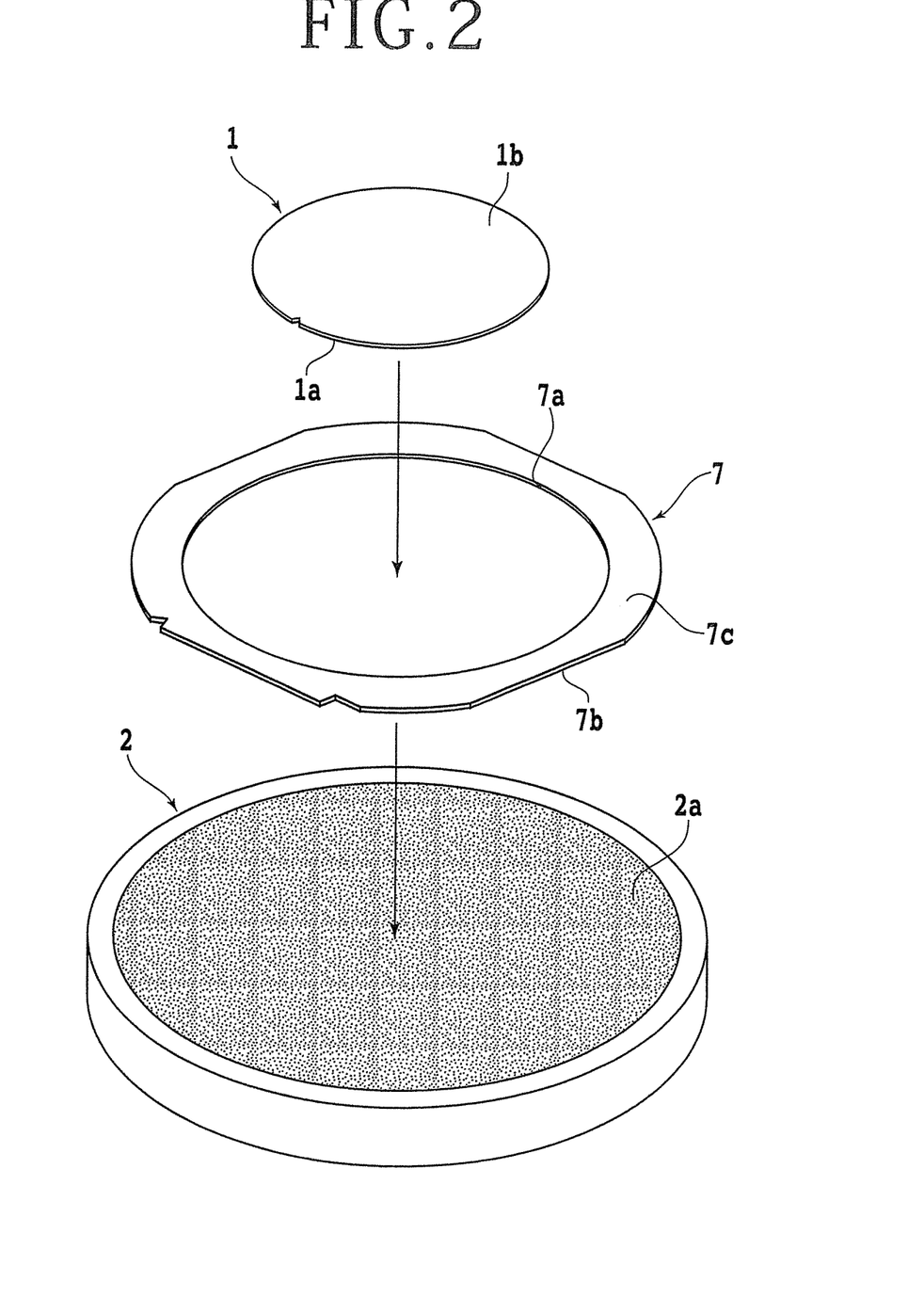
FIG. 2 is a schematic perspective view depicting a manner of positioning the wafer and a ring frame on a holding surface of a chuck table.

The steps of the processing method for the wafer 1 according to this preferred embodiment will now be described. Prior to uniting the wafer 1, the polyolefin sheet 9, and the ring frame 7, a polyolefin sheet providing step is performed by using a chuck table 2 having a holding surface 2a depicted in FIG. 2. FIG. 2 is a schematic perspective view depicting a manner of positioning the wafer 1 and the ring frame 7 on the holding surface 2a of the chuck table 2. That is, the polyolefin sheet providing step is performed on the holding surface 2a of the chuck table 2 as depicted in FIG. 2. The chuck table 2 has a circular porous member having a diameter larger than the outer diameter of the ring frame 7. The porous member constitutes a central upper portion of the chuck table 2. The porous member has an upper surface functioning as the holding surface 2a of the chuck table 2. A suction passage (not depicted) is formed in the chuck table 2, in which one end of the suction passage is connected to the porous member. Further, a vacuum source 2b (see FIG. 3) is connected to the other end of the suction passage. The suction passage is provided with a selector 2c (see FIG. 3) for switching between an ON condition and an OFF condition. When the ON condition is established by the selector 2c, a vacuum produced by the vacuum source 2b is applied to a workpiece placed on the holding surface 2a of the chuck table 2, thereby holding the workpiece on the chuck table 2 under suction.

Figure 3:
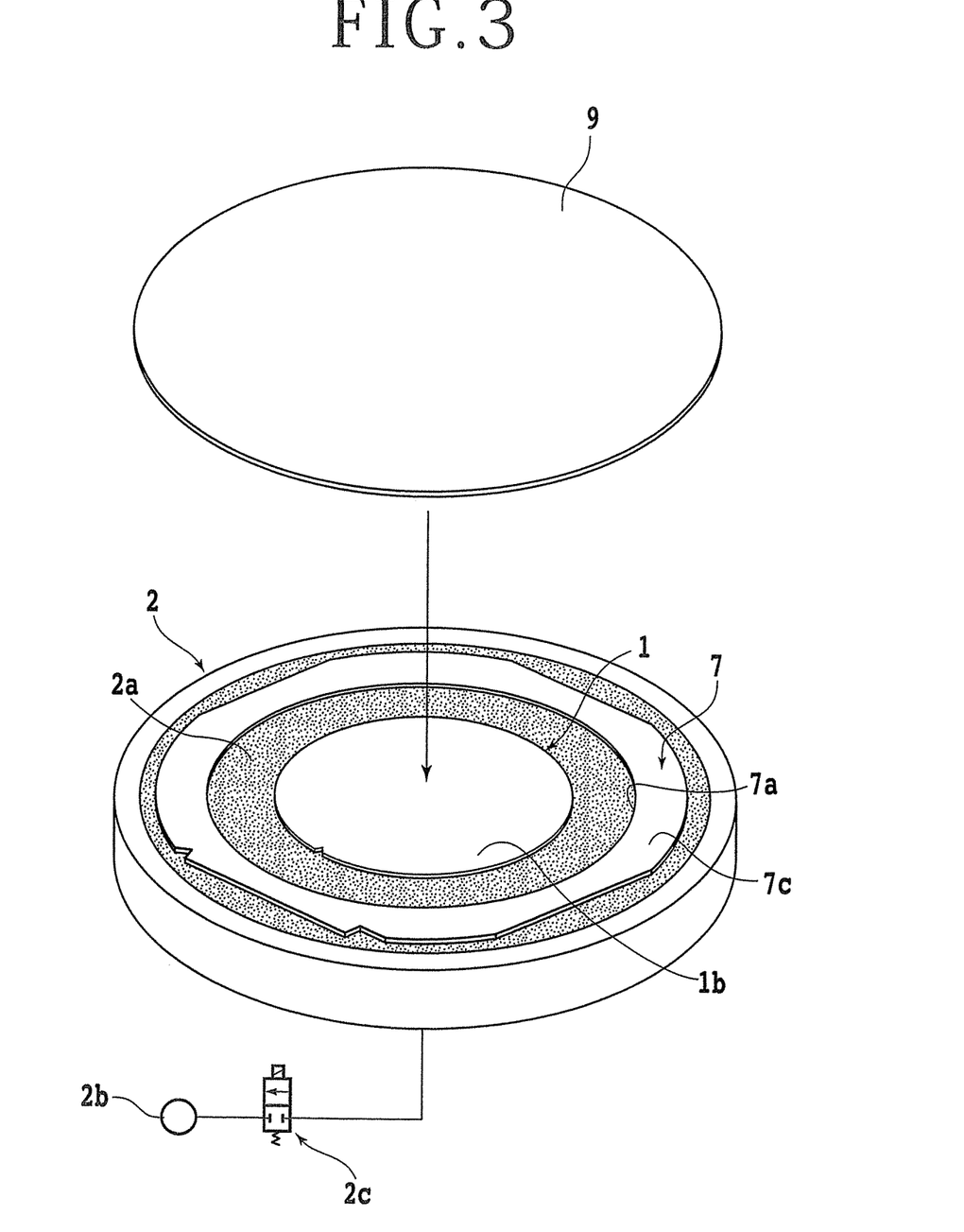
FIG. 3 is a schematic perspective view depicting a polyolefin sheet providing step.

In the polyolefin sheet providing step, the wafer 1 and the ring frame 7 are first placed on the holding surface 2a of the chuck table 2 as depicted in FIG. 2. At this time, the front side 1a of the wafer 1 is oriented downward, and the front side 7b of the ring frame 7 is also oriented downward. In this condition, the wafer 1 is positioned in the inside opening 7a of the ring frame 7. Thereafter, as depicted in FIG. 3, the polyolefin sheet 9 is provided on the back side 1b (upper surface) of the wafer 1 and on the back side 7c (upper surface) of the ring frame 7. FIG. 3 is a schematic perspective view depicting a manner of providing the polyolefin sheet 9 on the wafer 1 and the ring frame 7. That is, as depicted in FIG. 3, the polyolefin sheet 9 is provided so as to fully cover the wafer 1 and the ring frame 7. In the polyolefin sheet providing step, the diameter of the polyolefin sheet 9 is set larger than the diameter of the holding surface 2a of the chuck table 2. Unless the diameter of the polyolefin sheet 9 is larger than the diameter of the holding surface 2a, there may arise a problem such that, when the vacuum from the vacuum source 2b is applied to the holding surface 2a of the chuck table 2 in a uniting step to be performed later, the vacuum may leak from any gap between the polyolefin sheet 9 and the holding surface 2a because the holding surface 2a is not fully covered with the polyolefin sheet 9, so that a pressure cannot be properly applied to the polyolefin sheet 9.

Figure 4:
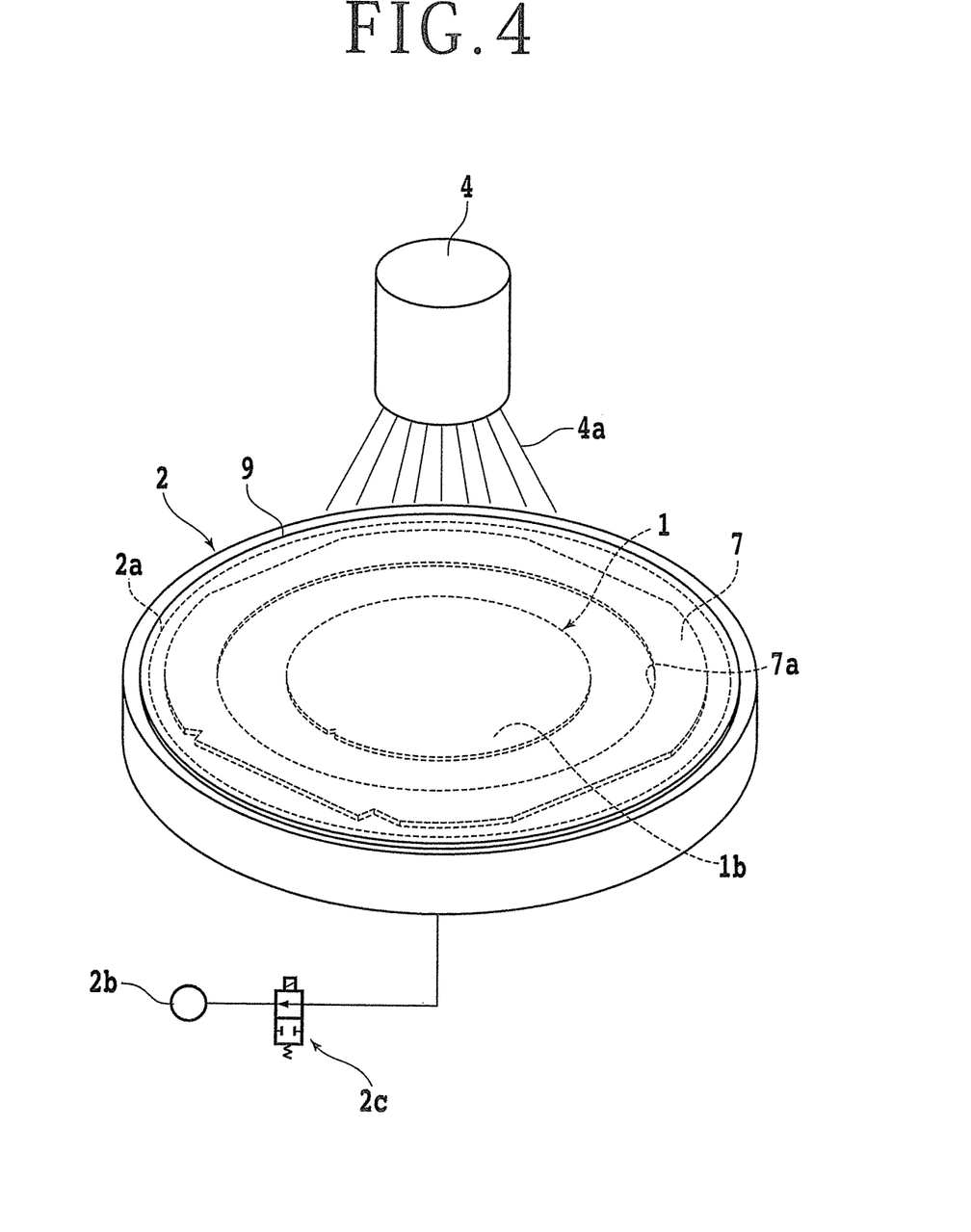
FIG. 4 is a schematic perspective view depicting a uniting step.

In the processing method for the wafer 1 according to this preferred embodiment, a uniting step is next performed in such a manner that the polyolefin sheet 9 is heated to unite the wafer 1 and the ring frame 7 through the polyolefin sheet 9 by thermocompression bonding. FIG. 4 is a schematic perspective view depicting the uniting step according to this preferred embodiment. As depicted in FIG. 4, the polyolefin sheet 9 transparent or translucent to visible light is provided so as to fully cover the wafer 1, the ring frame 7, and the holding surface 2a of the chuck table 2, which are all depicted by broken lines in FIG. 4. In the uniting step, the selector 2c is operated to establish the ON condition where the vacuum source 2b is in communication with the porous member of the chuck table 2, i.e., the holding surface 2a of the chuck table 2, so that a vacuum produced by the vacuum source 2b is applied to the polyolefin sheet 9 provided on the chuck table 2. Accordingly, the polyolefin sheet 9 is brought into close contact with the wafer 1 and the ring frame 7 by the atmospheric pressure applied to the upper surface of the polyolefin sheet 9.

Thereafter, the polyolefin sheet 9 is heated in a condition where the polyolefin sheet 9 is sucked by the vacuum source 2b, thereby performing thermocompression bonding. In this preferred embodiment depicted in FIG. 4, for example, the heating of the polyolefin sheet 9 is effected by a heat gun 4 provided above the chuck table 2. The heat gun 4 includes heating means such as a heating wire and an air blowing mechanism such as a fan. Accordingly, the heat gun 4 can heat ambient air and blow the heated air. In a condition where the vacuum from the vacuum source 2b is applied to the polyolefin sheet 9, the heat gun 4 is operated to supply hot air 4a to the upper surface of the polyolefin sheet 9. Accordingly, when the polyolefin sheet 9 is heated to a predetermined temperature, the polyolefin sheet 9 is bonded to the wafer 1 and the ring frame 7 by thermocompression bonding.

Figure 5:
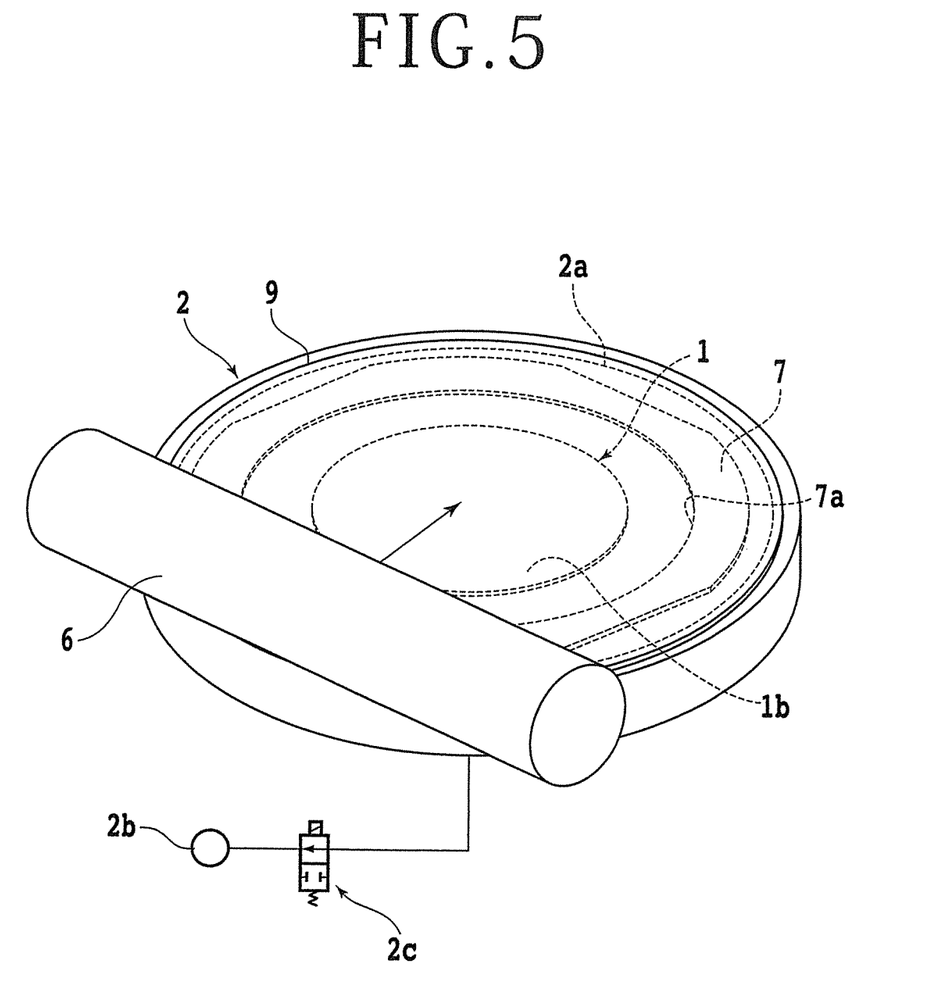
FIG. 5 is a schematic perspective view depicting a modification of the uniting step.

Another method for heating the polyolefin sheet 9 may be adopted. For example, any member heated to a predetermined temperature may be pressed on the polyolefin sheet 9 against the wafer 1 and the ring frame 7. FIG. 5 is a schematic perspective view depicting such a modification of the uniting step. As depicted in FIG. 5, the polyolefin sheet 9 transparent or translucent to visible light is provided so as to fully cover the wafer 1, the ring frame 7, and the holding surface 2a of the chuck table 2, which are all depicted by broken lines in FIG. 5. In this modification depicted in FIG. 5, a heat roller 6 including a heat source is used. More specifically, the vacuum produced by the vacuum source 2b is first applied to the polyolefin sheet 9, so that the polyolefin sheet 9 is brought into close contact with the wafer 1 and the ring frame 7 by the atmospheric pressure applied to the upper surface of the polyolefin sheet 9.

Thereafter, the heat roller 6 is heated to a predetermined temperature, and next placed on the holding surface 2a of the chuck table 2 at one end lying on the outer circumference of the holding surface 2a as depicted in FIG. 5. Thereafter, the heat roller 6 is rotated about its axis to roll on the chuck table 2 through the polyolefin sheet 9 from the above one end to another end diametrically opposite to the above one end. As a result, the polyolefin sheet 9 is bonded to the wafer 1 and the ring frame 7 by thermocompression bonding. In the case that a force for pressing the polyolefin sheet 9 is applied by the heat roller 6, the thermocompression bonding is effected at a pressure higher than atmospheric pressure. Preferably, a cylindrical surface of the heat roller 6 is coated with fluororesin. Further, the heat roller 6 may be replaced by any iron-like pressure member having a flat base plate and containing a heat source. In this case, the pressure member is heated to a predetermined temperature to thereby provide a hot plate, which is next pressed on the polyolefin sheet 9 held on the chuck table 2.

Figure 6:
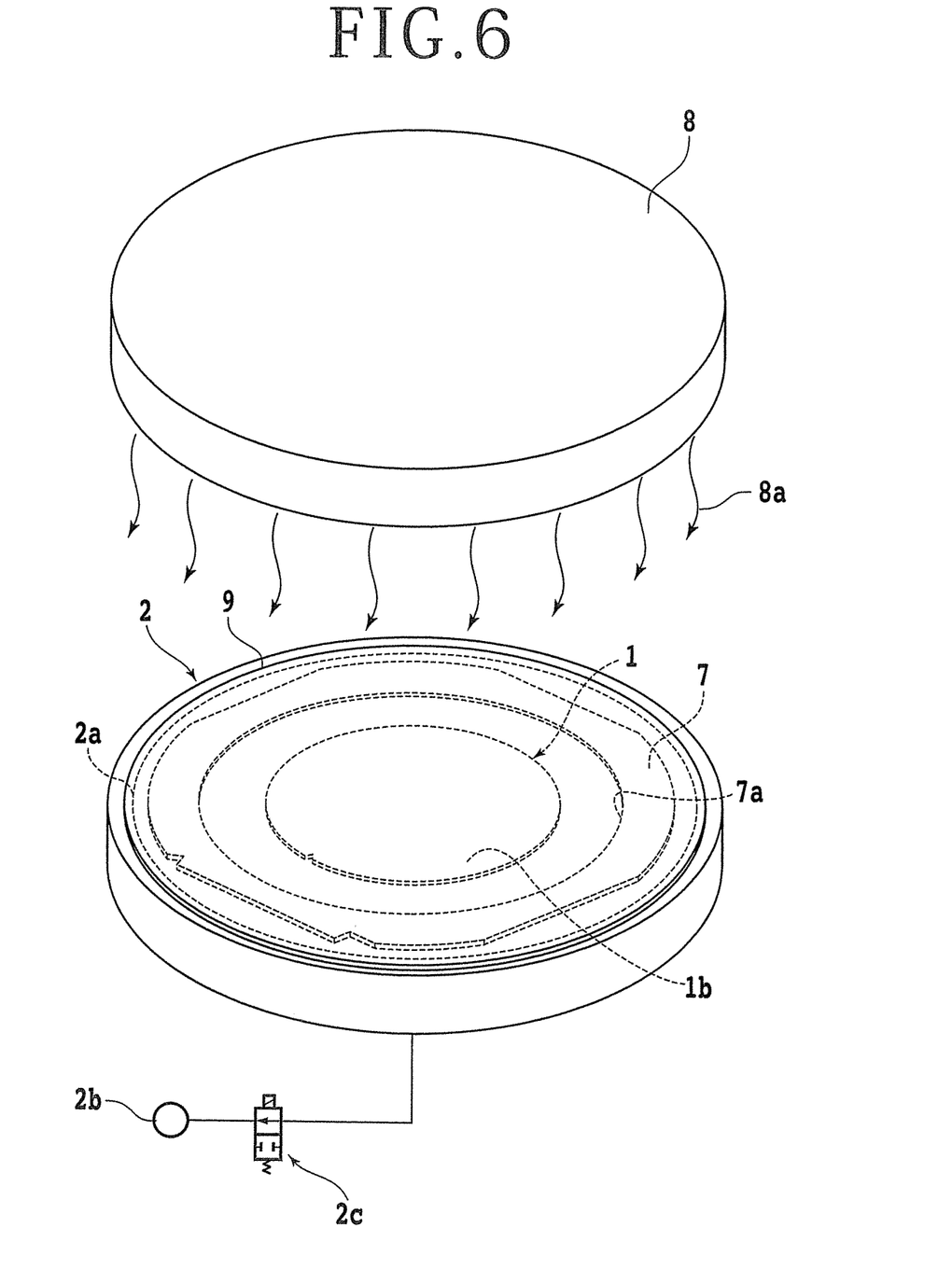
FIG. 6 is a schematic perspective view depicting another modification of the uniting step.

Still another method for heating the polyolefin sheet 9 may be adopted in the following manner. FIG. 6 is a schematic perspective view depicting such another modification of the uniting step. As depicted in FIG. 6, the polyolefin sheet 9 transparent or translucent to visible light is provided so as to fully cover the wafer 1, the ring frame 7, and the holding surface 2a of the chuck table 2, which are all depicted by broken lines in FIG. 6. In this modification depicted in FIG. 6, an infrared lamp 8 is provided above the chuck table 2 to heat the polyolefin sheet 9. The infrared lamp 8 can apply infrared light 8a having an absorption wavelength to at least the material of the polyolefin sheet 9. Also in the modification depicted in FIG. 6, the vacuum produced by the vacuum source 2b is first applied to the polyolefin sheet 9, so that the polyolefin sheet 9 is brought into close contact with the wafer 1 and the ring frame 7 by the atmospheric pressure applied to the upper surface of the polyolefin sheet 9. Thereafter, the infrared lamp 8 is operated to apply the infrared light 8a to the polyolefin sheet 9, thereby heating the polyolefin sheet 9. As a result, the polyolefin sheet 9 is bonded to the wafer 1 and the ring frame 7 by thermocompression bonding.

When the polyolefin sheet 9 is heated to a temperature near its melting point by performing any one of the above methods, the polyolefin sheet 9 is bonded to the wafer 1 and the ring frame 7 by thermocompression bonding. After bonding the polyolefin sheet 9, the selector 2c is operated to establish the OFF condition where the communication between the porous member of the chuck table 2 and the vacuum source 2b is canceled. Accordingly, the suction holding by the chuck table 2 is canceled.

Figure 7A:
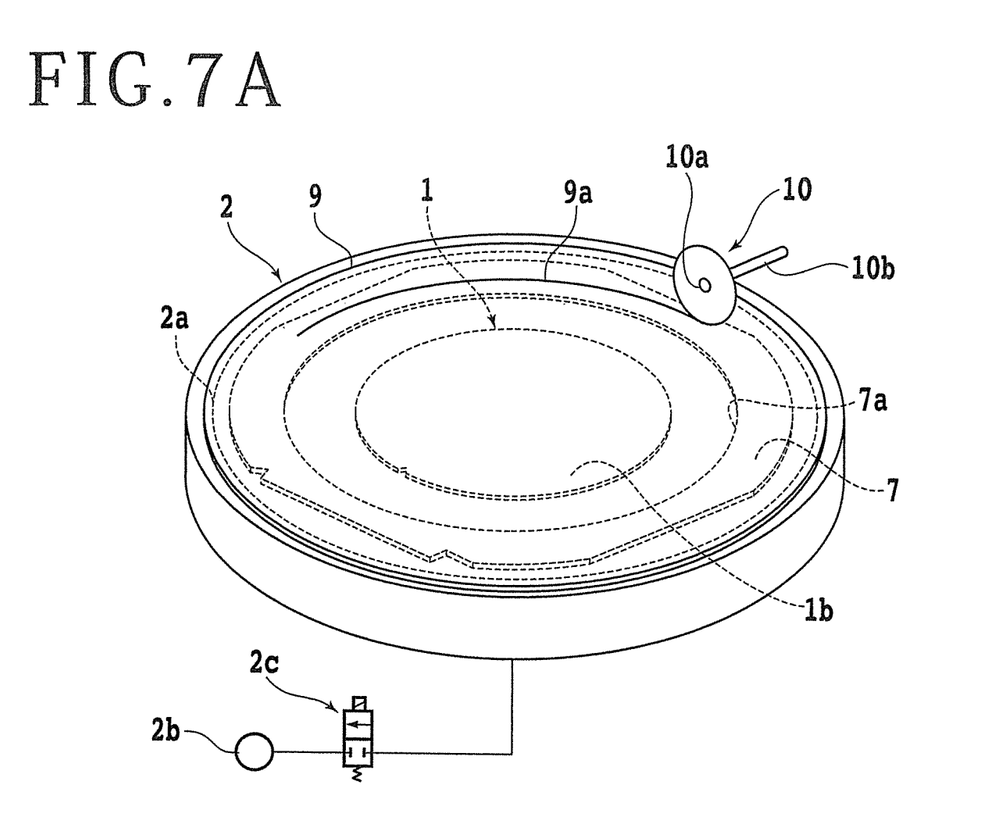
FIG. 7A is a schematic perspective view depicting a manner of cutting the polyolefin sheet after performing the uniting step.

Thereafter, the polyolefin sheet 9 is circularly cut along the outer circumference of the ring frame 7 to remove an unwanted peripheral portion of the polyolefin sheet 9. FIG. 7A is a schematic perspective view depicting a manner of cutting the polyolefin sheet 9. As depicted in FIG. 7A, a disc-shaped (annular) cutter 10 is used to cut the polyolefin sheet 9. The cutter 10 has a central through hole 10a in which a rotating shaft 10b is fitted. Accordingly, the cutter 10 is rotatable about the axis of the rotating shaft 10b. First, the cutter 10 is positioned above the ring frame 7. At this time, the rotating shaft 10b is set so as to extend in the radial direction of the chuck table 2. Thereafter, the cutter 10 is lowered until the outer circumference (cutting edge) of the cutter 10 comes into contact with the polyolefin sheet 9 placed on the ring frame 7. That is, the polyolefin sheet 9 is caught between the cutter 10 and the ring frame 7, so that the polyolefin sheet 9 is cut by the cutter 10 to form a cut mark 9a. Further, the cutter 10 is rolled on the polyolefin sheet 9 along a circular line set between the inner circumference of the ring frame 7 (i.e., the periphery of the inside opening 7a of the ring frame 7) and the outer circumference of the ring frame 7, thereby circularly forming the cut mark 9a along the above circular line. As a result, a predetermined central portion of the polyolefin sheet 9 is surrounded by the circular cut mark 9a. Thereafter, a remaining peripheral portion of the polyolefin sheet 9 outside the circular cut mark 9a is removed. That is, an unwanted peripheral portion of the polyolefin sheet 9 including an outermost peripheral portion outside the outer circumference of the ring frame 7 can be removed.

Figure 7B:
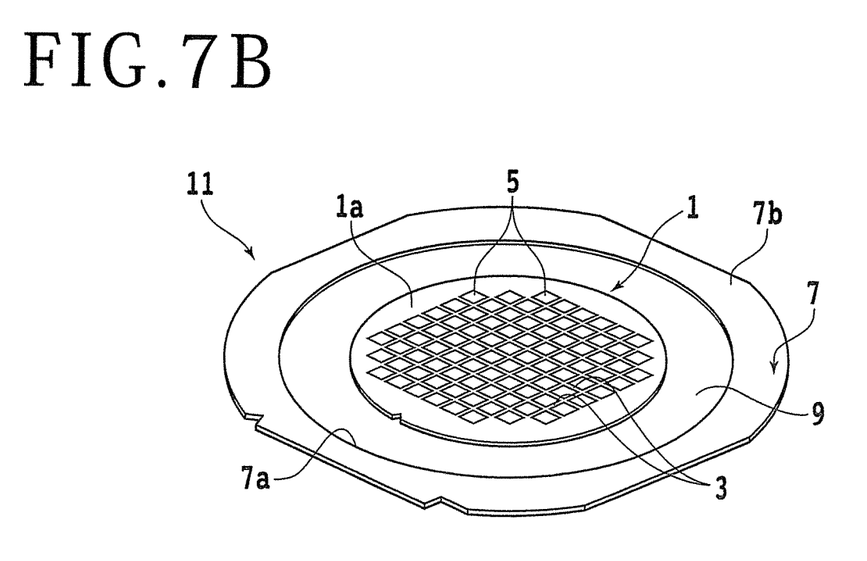
FIG. 7B is a schematic perspective view of a frame unit formed by performing the step depicted in FIG. 7A.

The cutter 10 may be replaced by an ultrasonic cutter for cutting the polyolefin sheet 9. Further, a vibration source for vibrating the cutter 10 at a frequency in an ultrasonic band may be connected to the cutter 10. Further, in cutting the polyolefin sheet 9, the polyolefin sheet 9 may be cooled to be hardened in order to facilitate the cutting operation. By cutting the polyolefin sheet 9 as mentioned above, a frame unit 11 depicted in FIG. 7B is formed, in which the frame unit 11 is composed of the wafer 1, the ring frame 7, and the polyolefin sheet 9 united together. That is, the wafer 1 and the ring frame 7 are united with each other through the polyolefin sheet 9 to form the frame unit 11 as depicted in FIG. 7B. FIG. 7B is a schematic perspective view of the frame unit 11 in a condition where the front side 1a of the wafer 1 and the front side 7b of the ring frame 7 are exposed upward.

In performing the thermocompression bonding as mentioned above, the polyolefin sheet 9 is heated preferably to a temperature lower than or equal to the melting point of the polyolefin sheet 9. If the heating temperature is higher than the melting point of the polyolefin sheet 9, there is a possibility that the polyolefin sheet 9 may be melted to such an extent that the shape of the polyolefin sheet 9 cannot be maintained. Further, the polyolefin sheet 9 is heated preferably to a temperature higher than or equal to the softening point of the polyolefin sheet 9. If the heating temperature is lower than the softening point of the polyolefin sheet 9, the thermocompression bonding cannot be properly performed. Accordingly, the polyolefin sheet 9 is heated preferably to a temperature higher than or equal to the softening point of the polyolefin sheet 9 and lower than or equal to the melting point of the polyolefin sheet 9. Further, there is a case that the softening point of the polyolefin sheet 9 may be unclear. To cope with such a case, in performing the thermocompression bonding, the polyolefin sheet 9 is heated preferably to a temperature higher than or equal to a preset temperature and lower than or equal to the melting point of the polyolefin sheet 9, the preset temperature being lower by 20° C. than the melting point of the polyolefin sheet 9.

In the case that the polyolefin sheet 9 is a polyethylene sheet, the heating temperature in the uniting step is preferably set in the range of 120° C. to 140° C. Further, in the case that the polyolefin sheet 9 is a polypropylene sheet, the heating temperature in the uniting step is preferably set in the range of 160° C. to 180° C. Further, in the case that the polyolefin sheet 9 is a polystyrene sheet, the heating temperature in the uniting step is preferably set in the range of 220° C. to 240° C.

The heating temperature is defined herein as the temperature of the polyolefin sheet 9 to be heated in performing the uniting step. As the heat sources included in the heat gun 4, the heat roller 6, and the infrared lamp 8 mentioned above, some kind of heat source capable of setting an output temperature has been put into practical use. However, even when such a heat source is used to heat the polyolefin sheet 9, the temperature of the polyolefin sheet 9 does not reach the output temperature set above in some case. To cope with such a case, the output temperature of the heat source may be set to a temperature higher than the melting point of the polyolefin sheet 9 in order to heat the polyolefin sheet 9 to a predetermined temperature.

Figure 8:
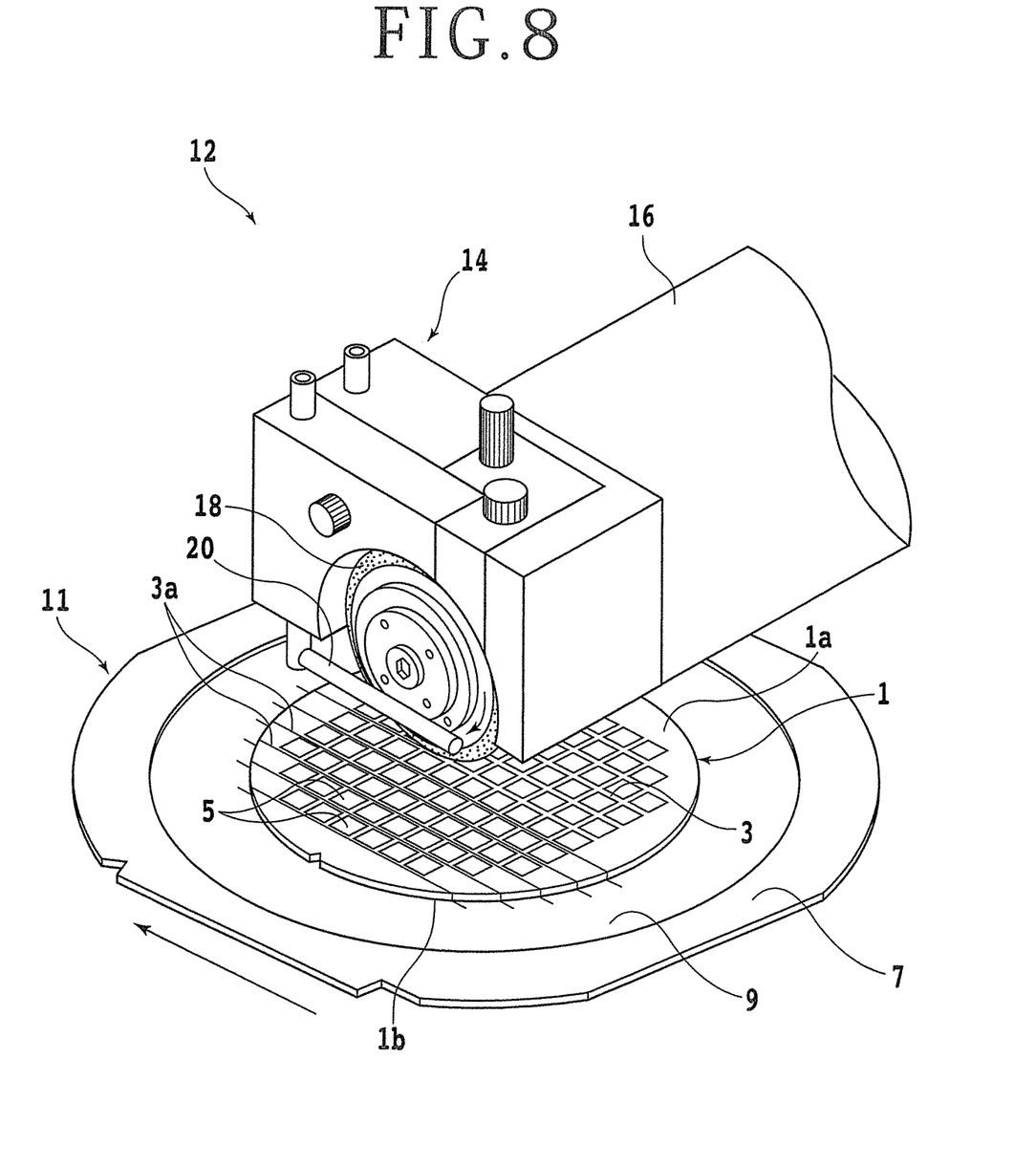
FIG. 8 is a schematic perspective view depicting a dividing step.

After performing the uniting step mentioned above, a dividing step is performed in such a manner that the wafer 1 in the condition of the frame unit 11 is cut by a cutting blade to obtain individual device chips. The dividing step is performed by using a cutting apparatus 12 depicted in FIG. 8 in this preferred embodiment. FIG. 8 is a schematic perspective view depicting the dividing step. As depicted in FIG. 8, the cutting apparatus 12 includes a cutting unit 14 for cutting a workpiece and a chuck table (not depicted) for holding the workpiece. The cutting unit 14 includes a cutting blade 18 having an annular abrasive portion (cutting edge) for cutting the workpiece and a spindle (not depicted) for supporting the cutting blade 18 so as to rotate the cutting blade 18. The cutting blade 18 has a central through hole for mounting the front end of the spindle. The cutting blade 18 is composed of an annular base (hub) having the above-mentioned central through hole and an annular abrasive portion provided along the outer circumference of the annular base. The spindle is rotatably supported in a spindle housing 16, and the base end of the spindle is connected to a spindle motor (not depicted) accommodated in the spindle housing 16. Accordingly, the cutting blade 18 can be rotated by operating the spindle motor. The chuck table has an upper surface as a holding surface for holding the wafer 1.

When the workpiece is cut by the cutting blade 18, heat is generated by the friction between the cutting blade 18 and the workpiece. Further, when the workpiece is cut by the cutting blade 18, cutting dust is generated from the workpiece. To remove such heat and cutting dust due to the cutting of the workpiece, cutting water such as pure water is supplied to the cutting blade 18 and the workpiece during the cutting of the workpiece. Accordingly, the cutting unit 14 includes a pair of cutting water nozzles 20 for supplying cutting water to the cutting blade 18 and the workpiece, in which the pair of cutting water nozzles 20 are located so as to face both sides of the cutting blade 18. In FIG. 8, only one of the two cutting water nozzles 20 is depicted.

In cutting the wafer 1, the frame unit 11 is placed on the chuck table in the condition where the front side 1a of the wafer 1 is exposed upward. Accordingly, the wafer 1 is held through the polyolefin sheet 9 on the chuck table. Thereafter, the chuck table is rotated to make the division lines 3 extending in the first direction on the front side 1a of the wafer 1 parallel to a feeding direction in the cutting apparatus 12. Further, the chuck table and the cutting unit 14 are relatively moved in a direction perpendicular to the feeding direction in a horizontal plane to thereby position the cutting blade 18 directly above an extension of a predetermined one of the division lines 3 extending in the first direction.

Thereafter, the spindle is rotated to thereby rotate the cutting blade 18. Thereafter, the cutting unit 14 is lowered to a predetermined height, and the chuck table and the cutting unit 14 are relatively moved in the feeding direction parallel to the upper surface of the chuck table. Accordingly, the abrasive portion of the cutting blade 18 being rotated comes into contact with the wafer 1 to thereby cut the wafer 1 along the predetermined division line 3 in the feeding direction. As a result, a cut mark 3a (groove) is formed along the predetermined division line 3 so as to fully cut the wafer 1 and the polyolefin sheet 9. After cutting the wafer 1 and the polyolefin sheet 9 along the predetermined division line 3, the chuck table and the cutting unit 14 are relatively moved in an indexing direction perpendicular to the feeding direction by the pitch of the division lines 3. Thereafter, the above cutting operation is similarly performed along the next division line 3 adjacent to the above predetermined division line 3. After similarly performing the cutting operation along all of the other division lines 3 extending in the first direction, the chuck table is rotated 90 degrees about its axis perpendicular to the holding surface, so that the other division lines 3 extending in the second direction perpendicular to the first direction become parallel to the feeding direction. Thereafter, the above cutting operation is similarly performed along all the other division lines 3 extending in the second direction. After performing the cutting operation along all the other division lines 3 extending in the second direction, the dividing step is finished.

The cutting apparatus 12 may include a cleaning unit (not depicted) provided in the vicinity of the cutting unit 14. That is, the wafer 1 cut by the cutting unit 14 may be transferred to the cleaning unit and then may be cleaned by the cleaning unit. For example, the cleaning unit includes a cleaning table having a holding surface for holding the frame unit 11 and a cleaning water nozzle adapted to be horizontally moved in opposite directions above the frame unit 11 held on the holding surface of the cleaning table. The cleaning water nozzle functions to supply cleaning water such as pure water to the wafer 1. The cleaning table is rotatable about its axis perpendicular to the holding surface. In operation, the cleaning table is rotated about its axis and at the same time the cleaning water is supplied from the cleaning water nozzle to the wafer 1. During this supply of the cleaning water, the cleaning water nozzle is horizontally moved in opposite directions along a path passing through the position directly above the center of the holding surface of the cleaning table. Accordingly, the entire surface of the front side 1a of the wafer 1 can be cleaned by the cleaning water.

By performing the dividing step as mentioned above, the wafer 1 is divided into the individual device chips, which are still supported to the polyolefin sheet 9. In cutting the wafer 1, the cutting unit 14 is positioned at a predetermined height such that the lower end of the cutting blade 18 is lower in level than the back side 1b of the wafer 1, in order to reliably divide the wafer 1. Accordingly, when the wafer 1 is cut by the cutting blade 18, the polyolefin sheet 9 bonded to the back side 1b of the wafer 1 is also cut by the cutting blade 18, so that cutting dust due to the polyolefin sheet 9 is generated. In the case that an adhesive tape having an adhesive layer is used in the frame unit 11 in place of the polyolefin sheet 9, cutting dust due to the adhesive layer of the adhesive tape is generated. In this case, the cutting dust is taken into the cleaning water supplied from the cutting water nozzles 20, and then diffused on the front side 1a of the wafer 1. The cutting dust due to the adhesive layer is apt to adhere again to the front side of each device 5. Furthermore, it is not easy to remove the cutting dust adhered to the front side of each device 5 in a cleaning step of cleaning the wafer 1 after the dividing step. When the cutting dust due to the adhesive layer adheres to each device 5, there arises a problem such that each device chip divided from the wafer 1 may be degraded in quality.

To the contrary, the processing method for the wafer 1 according to this preferred embodiment has the following advantage. In this preferred embodiment, the polyolefin sheet 9 having no adhesive layer is used in the frame unit 11 in place of an adhesive tape having an adhesive layer. Although the cutting dust due to the polyolefin sheet 9 is generated and then diffused on the front side 1a of the wafer 1 as being taken into the cleaning water, this cutting dust does not adhere to the wafer 1, but it is reliably removed in the subsequent cleaning step. Accordingly, it is possible to suppress a degradation in quality of each device chip due to the cutting dust.

Figure 9:
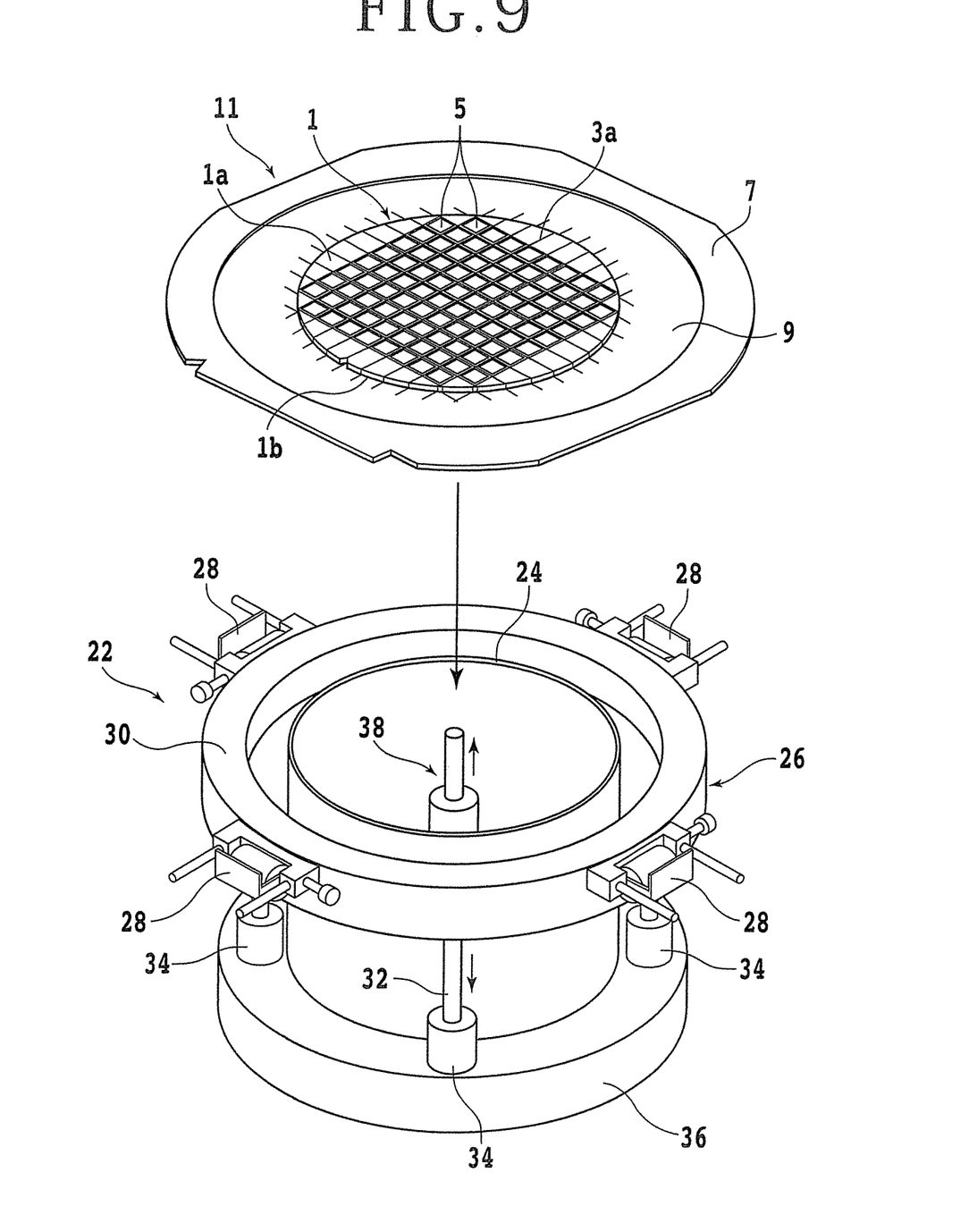
FIG. 9 is a schematic perspective view depicting a manner of loading the frame unit to a pickup apparatus after performing the dividing step.

After performing the dividing step or the cleaning step, a pickup step is performed to pick up each device chip from the polyolefin sheet 9. The pickup step is performed by using a pickup apparatus 22 depicted in FIG. 9. FIG. 9 is a schematic perspective view depicting a manner of loading the frame unit 11 to the pickup apparatus 22. As depicted in FIG. 9, the pickup apparatus 22 includes a cylindrical drum 24 and a frame holding unit 26 having a frame support table 30 provided around the cylindrical drum 24. The cylindrical drum 24 has an inner diameter larger than the diameter of the wafer 1 and an outer diameter smaller than the inner diameter of the ring frame 7 (the diameter of the inside opening 7a). The frame support table 30 of the frame holding unit 26 is an annular table having a circular inside opening larger in diameter than the drum 24. That is, the frame support table 30 has an inner diameter larger than the outer diameter of the drum 24. Further, the frame support table 30 has an outer diameter larger than the outer diameter of the ring frame 7. The inner diameter of the frame support table 30 is substantially equal to the inner diameter of the ring frame 7. The frame support table 30 has an upper surface as a supporting surface for supporting the ring frame 7 thereon through the polyolefin sheet 9. Initially, the height of the upper surface of the frame support table 30 is set equal to the height of the upper end of the drum 24 (see FIG. 10A). Further, the upper end portion of the drum 24 is surrounded by the inner circumference of the ring frame 7 in this initial stage.

A plurality of clamps 28 are provided on the outer circumference of the frame support table 30. Each clamp 28 functions to hold the ring frame 7 supported on the frame support table 30. That is, when the ring frame 7 of the frame unit 11 is placed through the polyolefin sheet 9 on the frame support table 30 and then held by each clamp 28, the frame unit 11 can be fixed to the frame support table 30. The frame support table 30 is supported by a plurality of rods 32 extending in a vertical direction. That is, each rod 32 is connected at its upper end to the lower surface of the frame support table 30. An air cylinder 34 for vertically moving each rod 32 is connected to the lower end of each rod 32. More specifically, the lower end of each rod 32 is connected to a piston (not depicted) movably accommodated in the air cylinder 34. Each air cylinder 34 is supported to a disc-shaped base 36. That is, the lower end of each air cylinder 34 is connected to the upper surface of the disc-shaped base 36. Accordingly, when each air cylinder 34 is operated in the initial stage, the frame support table 30 is lowered with respect to the drum 24 fixed in position.

Further, a pushup mechanism 38 for pushing up each device chip supported to the polyolefin sheet 9 is provided inside the drum 24. That is, each device chip is adapted to be pushed up through the polyolefin sheet 9 by the pushup mechanism 38 located below the polyolefin sheet 9. Further, a collet 40 (see FIG. 10B) capable of holding each device chip under suction is provided above the drum 24. Both the pushup mechanism 38 and the collet 40 are movable in a horizontal direction parallel to the upper surface of the frame support table 30. The collet 40 is connected through a selector 40b (see FIG. 10B) to a vacuum source 40a (see FIG. 10B).

Figure 10A:
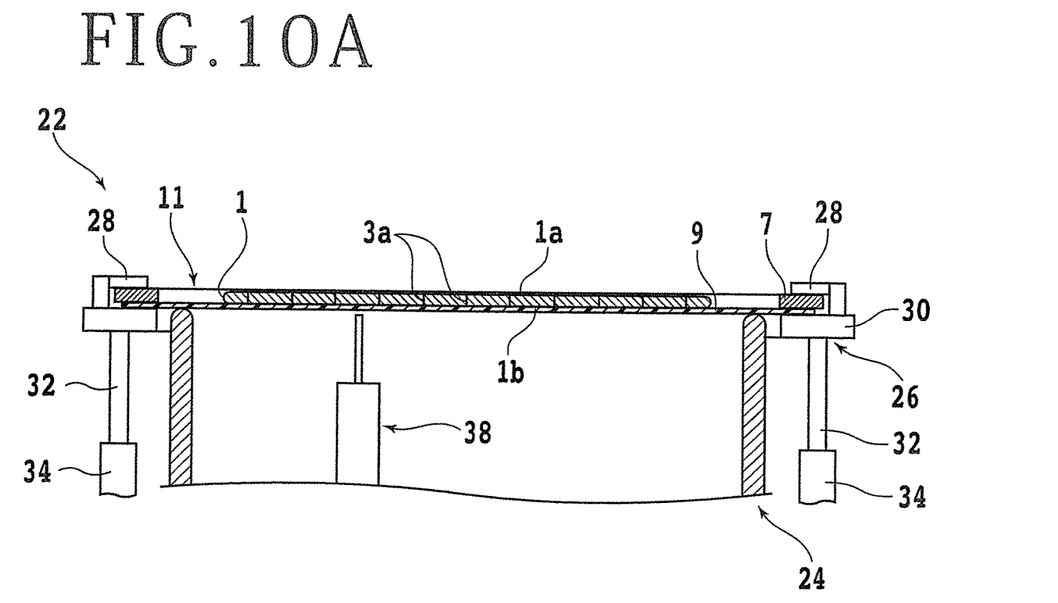
FIG. 10A is a schematic sectional view depicting a standby condition where the frame unit is fixed to a frame support table set at an initial position in a pickup step using the pickup apparatus depicted in FIG. 9.

In the pickup step, each air cylinder 34 in the pickup apparatus 22 is first operated to adjust the height of the frame support table 30 such that the height of the upper end of the drum 24 becomes equal to the height of the upper surface of the frame support table 30. Thereafter, the frame unit 11 transferred from the cutting apparatus 12 is placed on the drum 24 and the frame support table 30 in the pickup apparatus 22 in a condition where the front side 1a of the wafer 1 of the frame unit 11 is oriented upward. Thereafter, each clamp 28 is operated to fix the ring frame 7 of the frame unit 11 to the upper surface of the frame support table 30. FIG. 10A is a schematic sectional view depicting a standby condition where the frame unit 11 is fixed to the frame support table 30 set at the initial position. At this time, the plural cut marks 3a have already been formed in the wafer 1 in the dividing step, so that the wafer 1 has already been divided into a plurality of individual device chips 1c (see FIG. 10B).

Figure 10B:
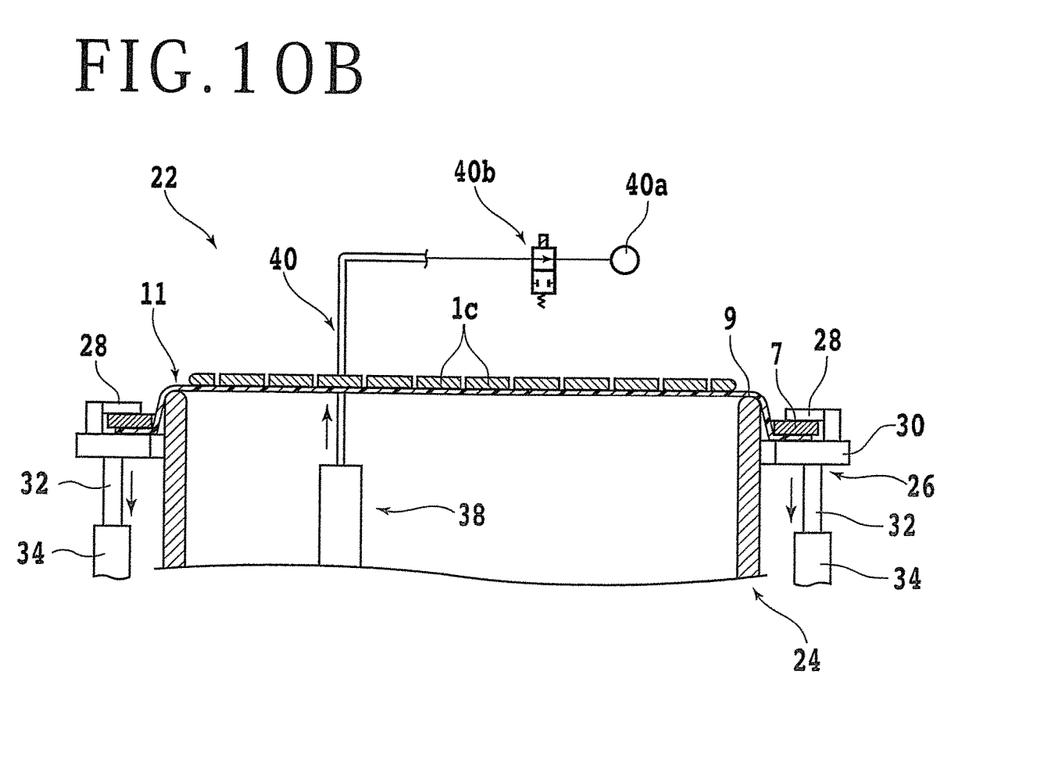
FIG. 10B is a schematic sectional view depicting a working condition where the frame support table holding the frame unit with the polyolefin sheet is lowered to expand the polyolefin sheet in the pickup step.

Thereafter, each air cylinder 34 is operated to lower the frame support table 30 of the frame holding unit 26 with respect to the drum 24. As a result, the polyolefin sheet 9 fixed to the frame holding unit 26 by each clamp 28 is expanded radially outward as depicted in FIG. 10B. FIG. 10B is a schematic sectional view depicting a working condition where the frame support table 30 holding the ring frame 7 with the polyolefin sheet 9 is lowered to expand the polyolefin sheet 9. When the polyolefin sheet 9 is expanded radially outward as mentioned above, the spacing between any adjacent ones of the device chips 1c supported to the polyolefin sheet 9 is increased as depicted in FIG. 10B. Accordingly, the contact between the adjacent device chips 1c can be suppressed, and each device chip 1c can be easily picked up. Thereafter, a target one of the device chips 1c is decided, and the pushup mechanism 38 is next moved to a position directly below this target device chip 1c as depicted in FIG. 10B. Furthermore, the collet 40 is also moved to a position directly above this target device chip 1c as depicted in FIG. 10B. Thereafter, the pushup mechanism 38 is operated to push up the target device chip 1c through the polyolefin sheet 9. Further, the selector 40b is operated to make the collet 40 communicate with the vacuum source 40a. As a result, the target device chip 1c is held under suction by the collet 40 and thereby picked up from the polyolefin sheet 9. Such a pickup operation is similarly performed for all the other device chips 1c. Thereafter, each device chip 1c picked up is mounted on a predetermined wiring substrate or the like for actual use.

In the wafer processing method according to this preferred embodiment mentioned above, the frame unit 11 including the wafer 1 can be formed without using an adhesive tape having an adhesive layer. Accordingly, in cutting the wafer 1, cutting dust due to the adhesive layer of the adhesive tape is not generated, so that this cutting dust does not adhere to each device chip 1c. As a result, there is no possibility that each device chip 1c may be degraded in quality.

The present invention is not limited to the above preferred embodiment, but various modifications may be made within the scope of the present invention. For example, while the polyolefin sheet 9 is selected from a polyethylene sheet, a polypropylene sheet, and a polystyrene sheet in the above preferred embodiment, this is merely illustrative. That is, the polyolefin sheet usable in the present invention may be formed of any other materials (polyolefins) such as a copolymer of propylene and ethylene and an olefin elastomer.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer along a plurality of division lines to obtain a plurality of individual device chips, the division lines being formed on the front side of the wafer to thereby define a plurality of separate regions where a plurality of devices are individually formed, the wafer processing method comprising:
a ring frame preparing step of preparing a ring frame having an inside opening for accommodating the wafer;
a polyolefin sheet providing step of positioning the wafer in the inside opening of the ring frame and providing a polyolefin sheet having no adhesive layer on a back side of the wafer and on a back side of the ring frame;
a uniting step of heating the polyolefin sheet while applying a pressure to the polyolefin sheet after performing the polyolefin sheet providing step, thereby uniting the wafer and the ring frame through the polyolefin sheet by thermocompression bonding to form a frame unit in a condition where the front side of the wafer and the front side of the ring frame are exposed;
a dividing step of cutting the wafer along each division line by using a cutting apparatus including a rotatable cutting blade after performing the uniting step, thereby dividing the wafer into the individual device chips; and
a pickup step of picking up each device chip from the polyolefin sheet after performing the dividing step.

2. The wafer processing method according to claim 1, wherein the uniting step includes a step of applying infrared light to the polyolefin sheet, thereby performing the thermocompression bonding.

3. The wafer processing method according to claim 1, wherein the polyolefin sheet is larger in size than the ring frame, and the uniting step includes an additional step of cutting the polyolefin sheet after heating the polyolefin sheet, thereby removing a part of the polyolefin sheet outside an outer circumference of the ring frame.

4. The wafer processing method according to claim 1, wherein the pickup step includes a first step of expanding the polyolefin sheet to thereby increase a spacing between any adjacent ones of the device chips and a second step of pushing up each device chip through the polyolefin sheet after performing the first step.

5. The wafer processing method according to claim 1, wherein the polyolefin sheet is formed of a material selected from the group consisting of polyethylene, polypropylene, and polystyrene.

6. The wafer processing method according to claim 1, wherein the wafer is formed of a material selected from the group consisting of silicon, gallium nitride, gallium arsenide, and glass.

7. The wafer processing method according to claim 5, wherein the polyolefin sheet is formed of polyethylene, and the polyolefin sheet is heated in the range of 120° C. to 140° C. in the uniting step.

8. The wafer processing method according to claim 5, wherein the polyolefin sheet is formed of polypropylene, and the polyolefin sheet is heated in the range of 160° C. to 180° C. in the uniting step.

9. The wafer processing method according to claim 5, wherein the polyolefin sheet is formed of polystyrene, and the polyolefin sheet is heated in the range of 220° C. to 240° C. in the uniting step.

10. A wafer processing method for dividing a wafer along a plurality of division lines to obtain a plurality of individual device chips, the division lines being formed on the front side of the wafer to thereby define a plurality of separate regions where a plurality of devices are individually formed, the wafer processing method comprising:
a ring frame preparing step of preparing a ring frame having an inside opening for accommodating the wafer;
a polyolefin sheet providing step of positioning the wafer in the inside opening of the ring frame and providing a polyolefin sheet having no adhesive layer on a back side of the wafer and on a back side of the ring frame;
a uniting step of heating the polyolefin sheet while applying a pressure to the polyolefin sheet after performing the polyolefin sheet providing step, thereby uniting the wafer and the ring frame through the polyolefin sheet by thermocompression bonding to form a frame unit in a condition where the front side of the wafer and the front side of the ring frame are exposed;
a dividing step of cutting the wafer along each division line by using a cutting apparatus including a rotatable cutting blade after performing the uniting step, thereby dividing the wafer into the individual device chips; and
a pickup step of picking up each device chip from the polyolefin sheet after performing the dividing step;
wherein the polyolefin sheet is formed of polystyrene, and the polyolefin sheet is heated in the range of 220° C. to 240° C. in the uniting step.

11. A wafer processing method for dividing a wafer along a plurality of division lines to obtain a plurality of individual device chips, the division lines being formed on the front side of the wafer to thereby define a plurality of separate regions where a plurality of devices are individually formed, the wafer processing method comprising:
a ring frame preparing step of preparing a ring frame having an inside opening for accommodating the wafer;
a polyolefin sheet providing step of positioning the wafer in the inside opening of the ring frame and providing a polyolefin sheet having no adhesive layer on a back side of the wafer and on a back side of the ring frame;
a uniting step of heating the polyolefin sheet while applying a pressure to the polyolefin sheet after performing the polyolefin sheet providing step, thereby uniting the wafer and the ring frame through the polyolefin sheet by thermocompression bonding to form a frame unit in a condition where the front side of the wafer and the front side of the ring frame are exposed;
a dividing step of cutting the wafer along each division line by using a cutting apparatus including a rotatable cutting blade after performing the uniting step, thereby dividing the wafer into the individual device chips; and
a pickup step of picking up each device chip from the polyolefin sheet after performing the dividing step;
wherein the polyolefin sheet is formed of a material selected from the group consisting of polyethylene, polypropylene, and polystyrene, and the polyolefin sheet is heated in the range of 130° to 240° C. in the uniting step.

* * * * *